(12) United States Patent
Bhowmik et al.

(10) Patent No.: US 6,288,449 B1
(45) Date of Patent: *Sep. 11, 2001

(54) BARRIER FOR COPPER METALLIZATION

(75) Inventors: Siddhartha Bhowmik, Orlando, FL (US); Sailesh Chittipeddi, Allentown, PA (US); Sailesh Mansinh Merchant, Orlando, FL (US)

(73) Assignee: Agere Systems Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/218,649

(22) Filed: Dec. 22, 1998

(51) Int. Cl.$^7$ .............................. H01L 23/48; H01L 23/52; B05D 5/12; C33C 16/00
(52) U.S. Cl. ............................................ 257/762; 257/773
(58) Field of Search .................................. 257/762, 773; 427/97, 123, 252

(56) References Cited

U.S. PATENT DOCUMENTS

| | | | |
|---|---|---|---|
| 5,595,937 | * 1/1997 | Mikagi | 437/192 |
| 5,668,054 | 9/1997 | Sun et al. | 538/653 |
| 5,676,587 | * 10/1997 | Landers et al. | 451/57 |
| 5,736,192 | * 4/1998 | Okamoto | 427/99 |
| 5,814,557 | * 9/1998 | Venkatraman et. | 438/622 |
| 5,880,018 | * 3/1999 | Boeck et al. | 438/619 |
| 5,916,011 | * 6/1999 | Kim et al. | 451/41 |
| 5,933,758 | * 8/1999 | Jain | 438/687 |
| 5,981,374 | * 11/1999 | Dalal et al. | 438/624 |
| 5,989,623 | * 11/1999 | Chen et al. | 427/97 |
| 6,004,188 | * 12/1999 | Roy | 451/41 |

FOREIGN PATENT DOCUMENTS 2 336 469  10/1999 (GB).

* cited by examiner

Primary Examiner—Olik Chaudhuri
Assistant Examiner—Shrinivas H. Rao
(74) Attorney, Agent, or Firm—Anthony Grillo; Scott W. McLellan

(57) ABSTRACT

The invention includes a process for copper metallization of an integrated circuit, comprising the steps of forming tantalum on a substrate, forming tantalum nitride over the tantalum, forming titanium nitride over the tantalum nitride, forming copper over the titanium nitride and integrated circuits made thereby. The invention is particularly useful in forming damascene structures with large aspect ratios.

5 Claims, 2 Drawing Sheets

BARRIER FOR COPPER METALLIZATION

FIELD OF THE INVENTION

The present invention is directed, in general, to integrated circuits and, more specifically, to an integrated circuit that includes copper metallization.

BACKGROUND OF THE INVENTION

Copper metallization is used to form interconnects in integrated circuits. This has been done in the past by masking and etching a semiconductor substrate to form features such as damascene structures, windows, trenches and vias, then metallizing with tantalum (which is used as a barrier), forming a copper seed layer by physical vapor deposition (PVD) and then electro-chemically depositing (ECD) copper by electroless or electrolytic plating. The substrate is polished and the resulting copper-filled trenches are referred to as a "damascene structure", as one example. Unfortunately, this approach is known to form an undesirable grain structure in the copper, i.e., the copper grains grow from the walls of the features inward. It is preferred that the grain structure grows from the bottom of the feature upward. While not completely understood, it is suspected that orientation of the grain boundaries of the copper in a direction perpendicular to the flow of current is advantageous in that it may inhibit electromigration. Alternatively, a concomitant reduction in total grain boundary area may also be advantageous in reducing copper or point dislocation diffusion, thereby also inhibiting electromigration. In any case, it has recently been suggested that the application of titanium nitride to the tantalum prior to deposition of the copper will result in formation of such a desirable grain structure in the copper. However, titanium nitride provides poor conformal coverage inside features with aspect ratios greater than about 2:1 (height, divided by diameter) thereby resulting in lack of copper fill-in in windows, vias or damascene structures and producing voids. Therefore, the creation of structures having higher aspect ratios would require repetition of the process suggested in the prior art in order to form "dual damascene" structures, which require an additional etch step to produce.

SUMMARY OF THE INVENTION

The invention includes a process for copper metallization of an integrated circuit, comprising the steps of forming tantalum on a substrate, forming tantalum nitride over the tantalum, forming titanium nitride over the tantalum nitride, and then forming copper over the titanium nitride, and integrated circuits made thereby. The invention is particularly useful in forming damascene structures with large aspect ratios. Use of this novel barrier improves electroplated copper interconnect reliability in integrated circuits. The invention may be used in all technologies with copper metallization.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity.

DETAILED DESCRIPTION OF THE INVENTION

Figure 1:
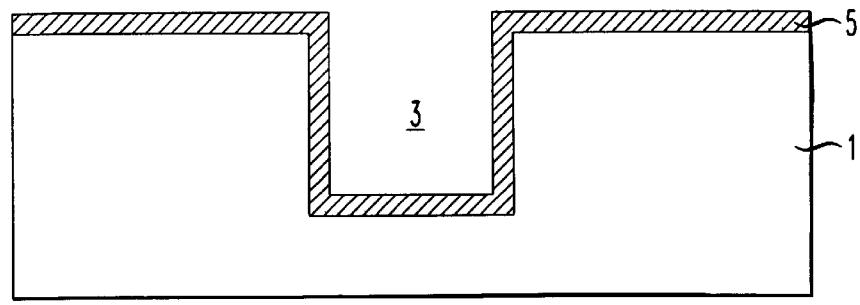
FIGS. 1–5 show a cross-sectional view of an integrated circuit during various steps in accordance with an embodiment of the invention.
Figure 2:
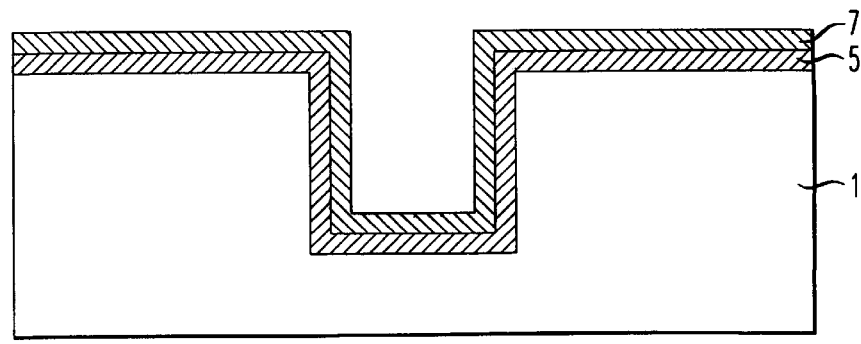
Figure 3:
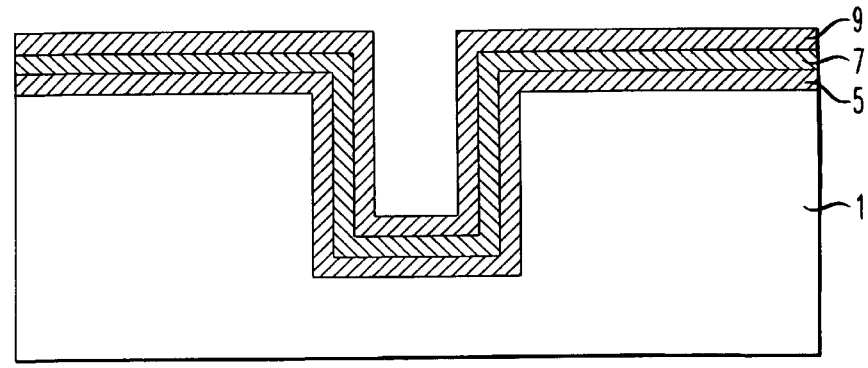
Figure 4:
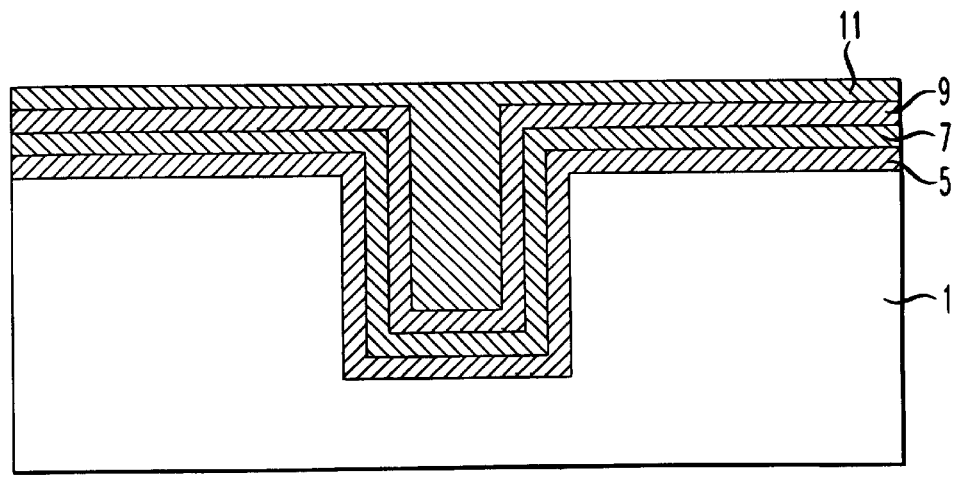
Figure 5:
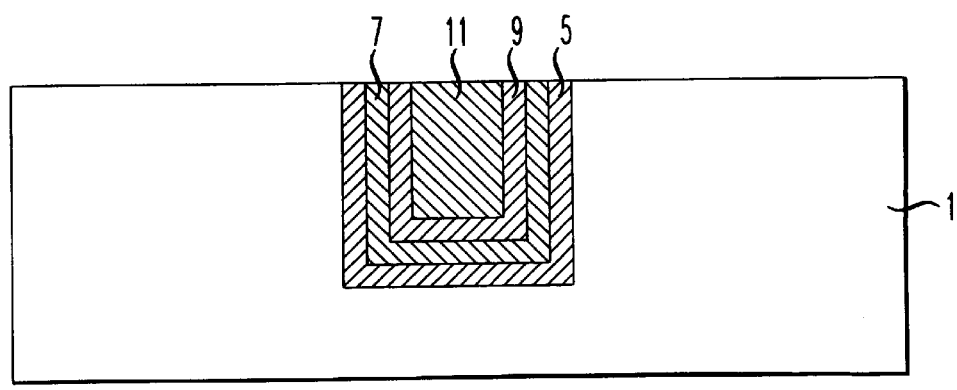

An embodiment of the invention may be understood with reference to FIG. 1, which shows, for one embodiment of the invention, a substrate 1, comprising a trench 3, that has a layer 5 of tantalum formed over the substrate 1. FIG. 2 shows that a layer of tantalum nitride 7 is then formed over the layer of tantalum 5. A layer of titanium nitride 9 is then formed over the tantalum nitride 7, as shown in FIG. 3. Copper 11 is then formed over the titanium nitride 9, as shown in FIG. 4. FIG. 5 shows that the substrate is planarized to remove copper, the remaining copper-filled trench being a damascene structure. The damascene trench is but one example; further structures and features that benefit from the present invention are vias, windows, steps in general and the like The barrier in this system is tantalum/tantalum nitride/titanium nitride. Tantalum nitride posses an ability to form a more conformal coating on the tantalum, especially on the walls, than titanium nitride does. This allows for the creation of damascene structures using features with greater aspect ratio than can be covered by titanium nitride. While not wishing to be held to any theory, note that tantalum nitride can be formed by reacting the tantalum with a nitrogen containing plasma, which then converts all exposed tantalum, including the walls of vias and trenches to tantalum nitride. However, PVD titanium nitride is more line-of-sight-in character, providing less step coverage. While not completely understood, it may be that the passivation of the tantalum walls of a trench with tantalum nitride inhibits the tantalum from nucleating the undesirable sideways growth of copper grains into the center of the trench, even if the walls are locally only thinly, or not at all, covered by titanium nitride, while the simultaneous presence of titanium nitride at the base of the trench allows for the desirable vertical columnar copper grain orientation to initiate. Note that when tantalum/tantalum nitride has been used as a barrier alone in the past, poor electromigration reliability has been observed.

The ability of the tantalum nitride to provide conformal coverage aids the titanium nitride in providing an underlayer that produces superior texture for copper, and hence improved reliability. A single layer of either tantalum nitride or titanium nitride as part of the stack will provide one advantage or the other, but not both, as offered by the present invention.

The substrate 1 of the present invention will generally be a semiconductor such as silicon, germanium, gallium arsenide and the like. The features that may be present in the substrate include damascene structures, trenches, vias, windows, and the like.

The formation of the tantalum layer 5 is conventional and may be done by PVD, chemical vapor deposition (CVD) for example and is generally about 5 to about 50 nm thick.

The tantalum nitride layer 7 may be formed by plasma nitriding, PVD, CVD and the like. The thickness of the layer formed is from about 5 to about 100 nm, with about 10 to about 50 nm being preferred.

The titanium nitride layer 9 may be formed by PVD, CVD and the like. The thickness of the layer formed is from about 5 to about 100 nm, with about 10 to about 50 nm being preferred.

Copper 11 formation is generally done by applying a PVD or CVD or electroless seed layer (not shown) followed by ECD in the form of electroless or electrolytic plating. The copper may be planarized by chemical-mechanical polishing, for example.

The present invention uses a novel three-layer stack consisting of tantalum/tantalum nitride/titanium nitride deposited using PVD methods or a PVD or CVD tantalum-lCVD tantalum nitride/CVD titanium nitride barrier stack with a PVD (or CVD) Cu seed layer prior to electroplating the rest of the Cu to fill the damascene structure and form the interconnect.

One embodiment is the use of PVD tantalumlPVD tantalum nitride/PVD titanium nitride/PVD copper as the metal stack prior to ECD copper. In another embodiment of the present invention, the barrier stack consists of CVD films to provide even better step coverage in sub-0.25 micron structures, where large aspect ratio openings (windows and vias) would be difficult to fabricate because of poor conformance of PVD films. Therefore, combinations of CVD/PVD processes for the constituent films are preferred and an all CVD film stack is most preferred in order to deposit optimally conforming films. PVD will allow aspect ratios in the features to be copper filled of about 2:1 to about 2.5: 1, while CVD, being more conformal than PVD, will allow aspect ratios of about 4:1 to about 15:1.

Although the present invention has been described in detail, those skilled in the art should understand that they can make various changes, substitutions and alterations herein without departing from the spirit and scope of the invention in its broadest form.

What is claimed is:

1. An integrated circuit device comprising;

at least one feature with an aspect ratio up to about 15:1, within the feature a metal stack comprising:

a layer of tantalum between about 5 to 50 nm thick;

a layer of tantalum nitride between about 5 and 100 nm thick on the tantalum layer;

a layer of titanium nitride between about 5 and 100 nm thick on the tantalum nitride layer; and a layer of copper on the titanium nitride layer;

wherein at least one of the layers is formed by CVD.

2. The device of claim 1, wherein the feature has an aspect ratio up to about 4:1.

3. The device of claim 2, wherein the feature has an aspect ratio of at least about 2:1 and at least one layer is formed by PVD.

4. The device of claim 3, wherein the feature has an aspect ratio up to about 2.5:1 and at least one layer is formed by PVD.

5. The device of claim 1, wherein the feature selected from the group consisting of windows, trenches and vias.

* * * * *